(12) United States Patent
Chang et al.

(10) Patent No.: US 11,652,089 B2
(45) Date of Patent: May 16, 2023

(54) PANEL FOR DISPLAY BY MICRO LED AND METHOD FOR MAKING SAME

(71) Applicant: HON HAI PRECISION INDUSTRY CO., LTD., New Taipei (TW)

(72) Inventors: Wei-Chih Chang, New Taipei (TW); Kuo-Sheng Lee, New Taipei (TW); Chung-Wen Lai, New Taipei (TW); Po-Fu Chen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 139 days.

(21) Appl. No.: 17/357,650

(22) Filed: Jun. 24, 2021

(65) Prior Publication Data

US 2021/0320091 A1   Oct. 14, 2021

Related U.S. Application Data

(62) Division of application No. 16/381,246, filed on Apr. 11, 2019, now Pat. No. 11,088,120.

(Continued)

(51) Int. Cl.
*H01L 33/62* (2010.01)
*H01L 25/075* (2006.01)
(Continued)

(52) U.S. Cl.
CPC ...... *H01L 25/0753* (2013.01); *H01L 21/6835* (2013.01); *H01L 27/124* (2013.01);
(Continued)

(58) Field of Classification Search
CPC ....... H01L 2924/00; H01L 2924/12041; H01L 25/0753; H01L 33/0093; H01L 24/95
See application file for complete search history.

(56) References Cited

U.S. PATENT DOCUMENTS

| 10,672,805 B2 * | 6/2020 | Lee | H01L 25/13 |
| 2017/0179097 A1 * | 6/2017 | Zhang | H01L 25/167 |

(Continued)

FOREIGN PATENT DOCUMENTS

| CN | 105405943 | 3/2016 |
| CN | 105518877 | 4/2016 |

(Continued)

*Primary Examiner* — Jaehwan Oh
(74) *Attorney, Agent, or Firm* — ScienBiziP, P.C.

(57) ABSTRACT

A method for making a micro LED display panel not requiring high-accuracy or individual positioning includes providing a carrier substrate with micro LEDs, providing a TFT substrate including a driving circuit, and forming a conductive connecting element, an insulating layer, and a contact electrode layer on the TFT substrate. The insulating layer and the contact electrode layer are patterned to define a through hole, the first electrode is placed against the contact electrode layer, and different voltages Vref and Vdd are applied to the contact electrode layer and to the conductive connecting element respectively, creating an electrostatic attraction. The micro LEDs and the first electrode are transferred from the carrier substrate onto the TFT substrate; and the conductive connecting element is bonded to the first electrode. The method of making is simple. A micro LED display panel made by the method is also provided.

11 Claims, 7 Drawing Sheets

Related U.S. Application Data

(60) Provisional application No. 62/656,940, filed on Apr. 12, 2018.

(51) Int. Cl.
*H01L 33/60* (2010.01)
*H01L 27/12* (2006.01)
*H01L 21/683* (2006.01)

(52) U.S. Cl.
CPC .......... *H01L 27/1255* (2013.01); *H01L 33/60* (2013.01); *H01L 33/62* (2013.01); *H01L 2221/68354* (2013.01); *H01L 2221/68363* (2013.01); *H01L 2221/68386* (2013.01); *H01L 2933/0058* (2013.01); *H01L 2933/0066* (2013.01)

(56) References Cited

U.S. PATENT DOCUMENTS

| | | | |
|---|---|---|---|
| 2017/0278734 A1* | 9/2017 | Zou | H01L 21/67144 |
| 2019/0148415 A1* | 5/2019 | Lee | H01L 25/13 257/71 |

FOREIGN PATENT DOCUMENTS

| | | |
|---|---|---|
| TW | 201423242 | 6/2014 |
| TW | 201515260 | 4/2015 |

* cited by examiner

PANEL FOR DISPLAY BY MICRO LED AND METHOD FOR MAKING SAME

FIELD

The subject matter herein generally relates to LED displays.

BACKGROUND

A method for making a micro LED display panel can include transferring a plurality of micro LEDs from a carrier substrate onto a thin film transistor (TFT) substrate. However, since each of the micro LEDs is extremely small in size, no more than one hundred micrometers, methods for making the micro LED display panel require high precision.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

Figure 1:
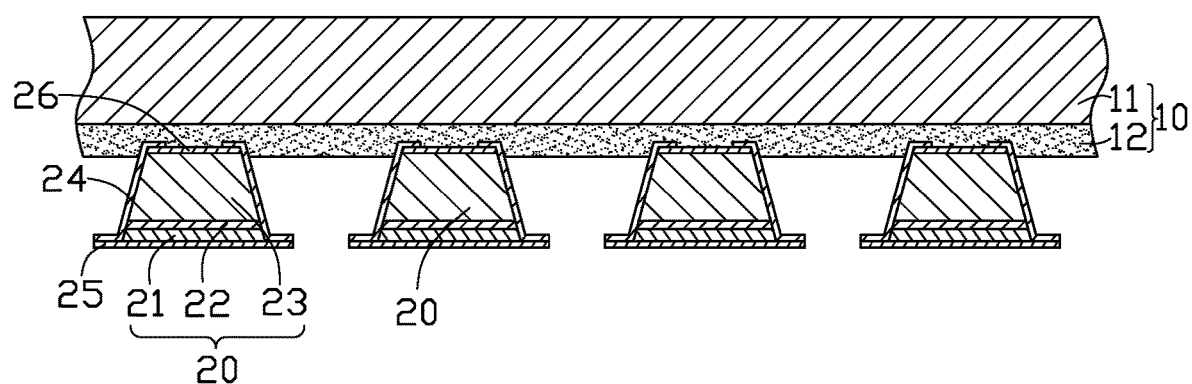
FIG. 1 is a cross-sectional view shown during step S1 of a method for making a micro LED display panel according to one embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

The embodiments of the present disclosure are shown in the drawings, and the disclosure may be embodied in many different forms and should not be construed as being limited to the embodiments set forth herein. Rather, these embodiments may not provide a complete disclosure of the disclosure and the scope of the disclosure. For clarity, the dimensions of the layers and regions are enlarged in the figures.

Certain terms used in this specification have meanings predetermined by the inventors. In particular, as used in the disclosure, "micro LED" refers to a light emitting diode (LED) having dimension of from one micrometer to about one hundred micrometers, and more specifically to an LED having at least one dimension less than one hundred micrometers.

A method for making a micro LED display panel according to one embodiment of the present disclosure is as follows.

Block S1: As shown in FIG. 1, a carrier substrate 10 with a plurality of micro LEDs 20 is provided. A first electrode 25 is on an end of each micro LED 20 away from the carrier substrate 10.

As shown in FIG. 1, the carrier substrate 10 includes a substrate 11 and an adhesive layer 12 on a surface of the substrate 11. The micro LEDs 20 are spaced apart from each other and embedded in the adhesive layer 12. The adhesive layer 12 is made of a material decomposable by ultraviolet irradiating or heating, causing non-adhesiveness.

As shown in FIG. 1, each micro LED 20 includes a P-type doped light emitting layer 21, an active layer 22, and an N-type doped light emitting layer 23. The active layer 22 is between the P-doped light emitting layer 21 and the N-doped light emitting layer 23. A second electrode 26 is on one end of each micro LED 20 adjacent to the carrier substrate 10. The N-doped light emitting layer 23 is electrically coupled to the second electrode 26, and the P-doped light emitting layer 21 is electrically coupled to the first electrode 25.

In one embodiment, each micro LED 20 is further provided with a protective layer 24 that wraps around side surfaces of the micro LED 20 and exposes the first electrode 25 and the second electrode 26. The protective layer 24 may be made of an oxide of silicon.

Figure 2:
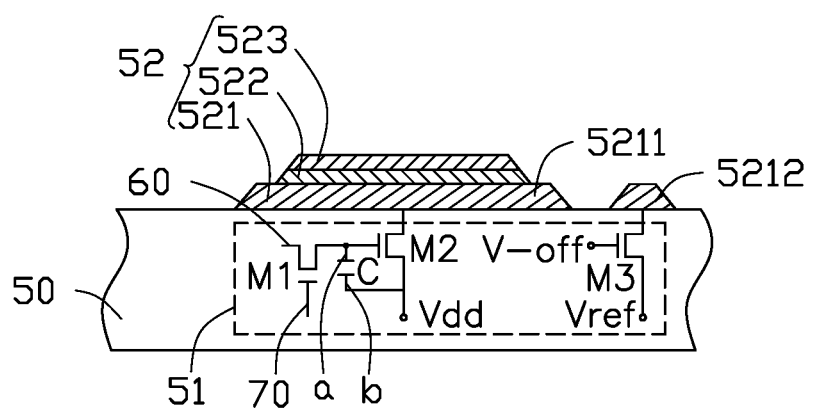
FIG. 2 is a cross-sectional view shown during step S2 of a method for making a micro LED display panel according to one embodiment.

Block S2: As shown in FIG. 2, a thin film transistor (TFT) substrate 50 is provided, the TFT substrate 50 includes a driving circuit 51, and a plurality of conductive connecting elements 52 electrically coupled to the driving circuit 51 is formed on the TFT substrate 50. FIG. 2 shows only one conductive connecting element 52.

In one embodiment, the TFT substrate 50 is a multilayer structure and the driving circuit 51 includes a plurality of data lines 60, a plurality of scan lines 70, a plurality of storage capacitors C, a plurality of first TFTs M1, a plurality of second TFTs M2, and a plurality of third TFTs M3. FIG. 2 shows only one data line 60, one scan line 70, one storage capacitor C, one first TFT M1, one second TFT M2, and one third TFT M3. The data lines 60 extend in a first direction (not shown), the scan lines 70 extend in a second direction (not shown) intersecting the first direction. One sub-pixel unit (not shown) is defined by all adjacent scan lines 70 and all adjacent data lines 60. Each micro LED 20 corresponds to one sub-pixel unit. Through the TFT substrate 50, the driving circuit 51 drives the micro LEDs 20 to emit light.

FIG. 2 shows an equivalent circuit diagram of one sub-pixel unit. As shown in FIG. 2, each sub-pixel unit includes one storage capacitor C, one first TFT M1, one second TFT M2, and one third TFT M3. The storage capacitor C includes a first end a and a second end b electrically coupled to a direct current voltage Vdd. The first TFT M1 includes a source electrode electrically coupled to one data line 60, a gate electrode electrically coupled to one scan line 70, and a drain electrode electrically coupled to the first end a of the storage capacitor C. The second TFT M2 includes a source electrode electrically coupled to the direct current voltage Vdd, a gate electrode electrically coupled to the first end a of the storage capacitor C, and a drain electrode electrically coupled to one conductive connecting element 52. The third TFT M3 includes a source electrode electrically coupled to a reference voltage Vref, a gate electrode electrically coupled to a control voltage V-off, and a drain electrode electrically coupled to one conductive connecting element 52. The direct current voltage Vdd is different from the reference voltage Vref.

In one embodiment, the conductive connecting elements 52 formed on the TFT substrate 50 are spaced, each conductive connecting element 52 corresponds to one micro LED 20 and is configured to electrically connect to the first electrode 25 of the micro LED 20. The conductive connecting element 52 includes a conductive solder layer 523 on the TFT substrate 50. In the present embodiment, the conductive connecting element 52 further includes a base conductive layer 521 on the TFT substrate 50 and a conductive barrier layer 522 on a side of the base conductive layer 521 away from the TFT substrate 50. The conductive barrier layer 522 is between the base conductive layer 521 and the conductive solder layer 523 and prevents the material of the conductive solder layer 523 from diffusing into the base conductive layer 521.

In one embodiment, the base conductive layer 521 includes a first portion 5211 and a second portion 5212 spaced apart and insulated from the first portion 5211. The conductive barrier layer 522 and the conductive solder layer 523 are sequentially stacked on the first portion 5211, and a side of the second portion 5212 away from the TFT substrate 50 is not covered by the conductive barrier layer 522 and the conductive solder layer 523. The drain electrode of the second TFT M2 is electrically coupled to the first portion 5211. The drain electrode of the third TFT M3 is electrically coupled to the second portion 5212.

In one embodiment, the base conductive layer 521 may be made of indium tin oxide, the conductive solder layer 523 may be made of tin, and the conductive barrier layer 522 may be made of nickel or gold. The conductive barrier layer 522 prevents the material of the conductive solder layer 523 from diffusing to the base conductive layer 521. The base conductive layer 521 is configured for reflecting the light emitted by the micro LEDs 20 toward the side away from the TFT substrate 50, thereby improving light emitting efficiency of the micro LED display panel.

Figure 3:
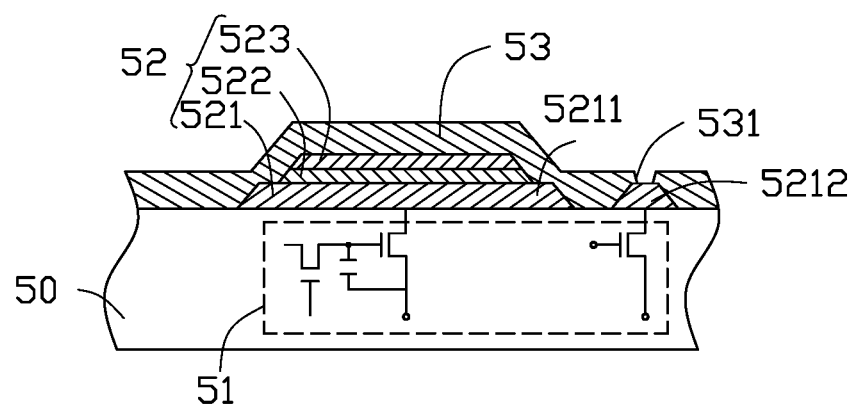
FIG. 3 is a cross-sectional view shown during step S3 of a method for making a micro LED display panel according to one embodiment.

Block S3: As shown in FIG. 3, an insulating layer 53 covering the conductive connecting element 52 is formed on the TFT substrate 50.

As shown in FIG. 3, the insulating layer 53 defines a contact hole 531 exposing the second portion 5212 of the base conductive layer 521. In one embodiment, the insulating layer 53 may be made of an oxide of silicon.

Figure 4:
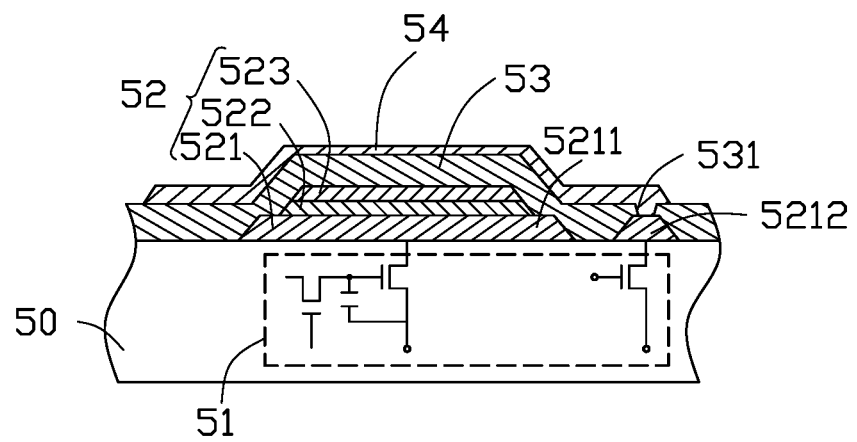
FIG. 4 is a cross-sectional view shown during step S4 of a method for making a micro LED display panel according to one embodiment.

Block S4: As shown in FIG. 4, a contact electrode layer 54 is formed on a side of the insulating layer 53 away from the TFT substrate 50, and the contact electrode layer 54 extends through the insulating layer 53 to be electrically coupled to the driving circuit 51.

As shown in FIG. 4, the contact electrode layer 54 fills the contact hole 531 and is electrically coupled to the driving circuit 51 by the second portion 5212 of the base conductive layer 521.

Figure 5:
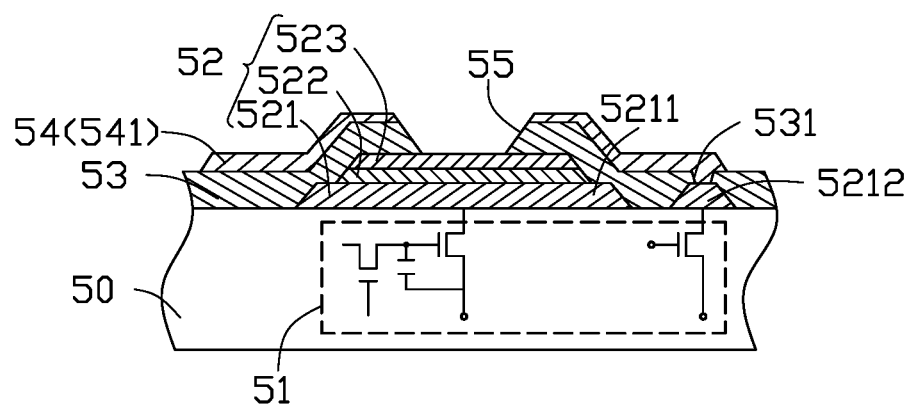
FIG. 5 is a cross-sectional view shown during step S5 of a method for making a micro LED display panel according to one embodiment.

Block S5: As shown in FIG. 5, the insulating layer 53 and the contact electrode layer 54 are patterned to define a through hole 55 in the contact electrode layer 54 and the insulating layer 53. The through hole 55 extends through the contact electrode layer 54 and the insulating layer 53 to expose the conductive connecting element 52.

As shown in FIG. 5, the through hole 55 exposes a portion of the conductive solder layer 523.

In one embodiment, the contact electrode layer 54 is patterned to form a plurality of spaced contact electrodes 541 (FIG. 5 only shows one contact electrode 541). Each contact electrode 541 corresponds to one conductive connecting element 52.

Figure 6:
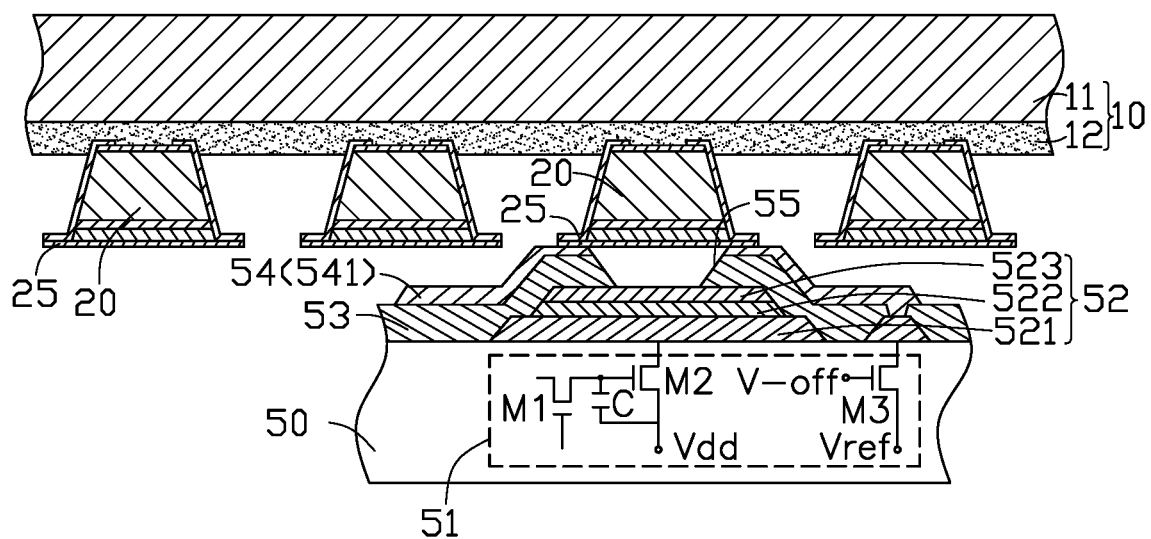
FIG. 6 is a cross-sectional view shown during step S6 of a method for making a micro LED display panel according to one embodiment.

Block S6: As shown in FIG. 6, during the process of transferring the micro LEDs 20, the first electrode 25 of the micro LED 20 resists against the contact electrode layer 54. The reference voltage Vref is applied to the contact electrode layer 54 by the driving circuit 51, and the direct current voltage Vdd (different from the reference voltage Vref) is applied to the conductive connecting element 52 by the driving circuit 51, causing electrostatic attraction between the first electrode 25 of the micro LED 20 and the conductive connecting element 52.

In one embodiment, each micro LED 20 is aligned with one conductive connecting element 52. The first electrode 25 of each micro LED 20 resists against one contact electrode 541 so as to be in direct contact with the contact electrode 541. During the process of transferring the micro LEDs 20, the first TFT M1, the second TFT M2, and the third TFT M3 are powered on while the TFT substrate 50, particularly the contact electrode 541, resists against the micro LEDs 20. The reference voltage Vref is thus applied to both the contact electrode layer 54 and the first electrode 25 of the micro LED 20, and the direct current voltage Vdd is applied to the conductive connecting element 52. The voltage difference between Vdd and Vref creates electrostatic attraction between the first electrode 25 of the micro LED 20 and the conductive connecting element 52 of the TFT substrate 50, the micro LED 20 and the TFT substrate 50 are thus attracted to each other.

As shown in FIG. 6, a projection of the first electrode 25 of the micro LED 20 on the TFT substrate 50 completely covers a projection of the through hole 55 on the TFT substrate 50.

Since the through hole 55 completely penetrates the contact electrode layer 54 and the insulating layer 53, a surface of the insulating layer 53 away from the TFT substrate 50 is completely covered by the contact electrode layer 54. Therefore, when the first electrode 25 of the micro LED 20 resists against the contact electrode layer 54, the first electrode 25 of the micro LED 20 cannot be in contact with the insulating layer 53 due to the through hole 55. High-precision accuracy in transferring of the micro-LEDs 20 to the TFT substrate 50 is reduced as a condition.

Figure 7:
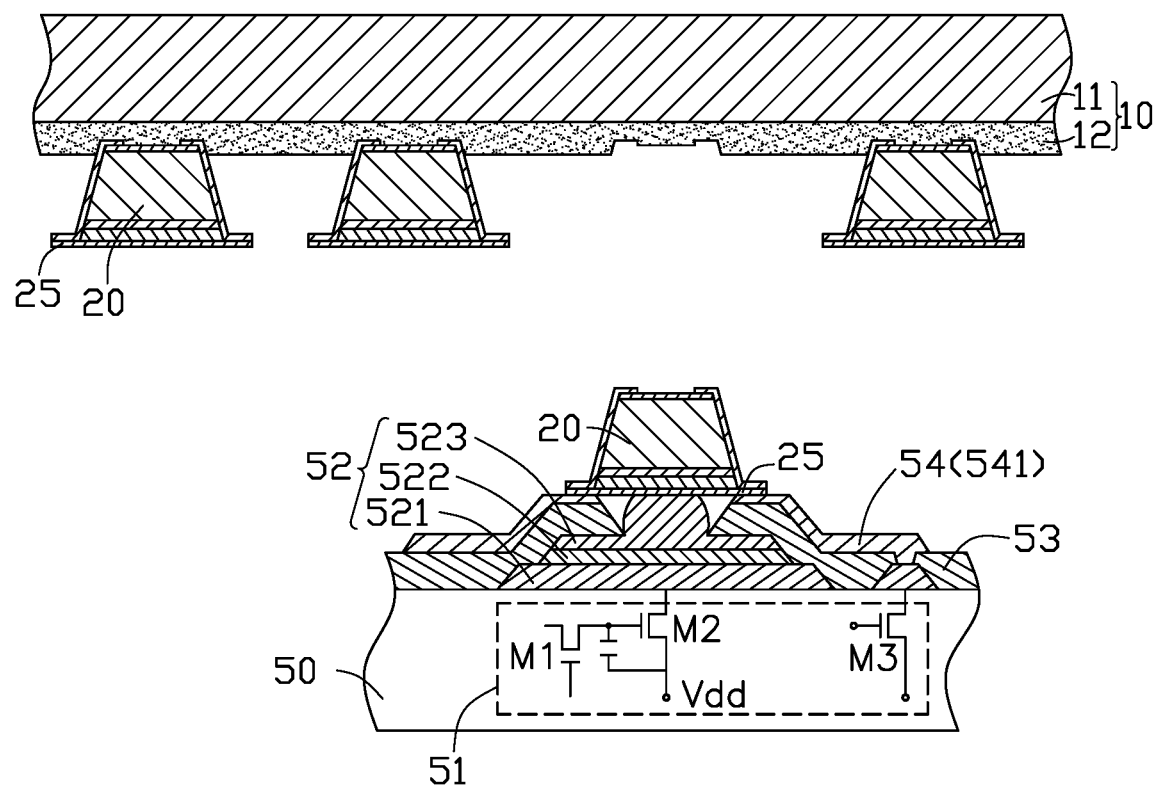
FIG. 7 is a cross-sectional view shown during steps S7 and S8 of a method for making a micro LED display panel according to one embodiment.

Block S7: As shown in FIG. 7, the micro LED 20 and the first electrode 25 are peeled off from the carrier substrate 10 and transferred to the TFT substrate 50.

In one embodiment, during the process of transferring the micro LED 20, the adhesive layer 12 is irradiated with ultraviolet light or heated in order to remove the adhesiveness of the adhesive layer 12, when the first TFT M1, the second TFT M2, and the third TFT M3 are to be powered on. The micro LED 20 and the first electrode 25 are thus peeled off from the adhesive layer 12 of the carrier substrate 10. After the micro LED 20 and the first electrode 25 are separated from the carrier plate 10, the attraction between the first electrode 25 of the micro LED 20 and the conductive connecting element 52 of the TFT substrate 50 renders the micro LED 20 stable on the TFT substrate 50 and effectively immovable on the TFT substrate 50.

Block S8: As shown in FIG. 7, the conductive connecting element 52 is treated so as to bond the first electrode 25 of the micro LED 20. Therefore, the micro LED 20 is permanently fixed to the TFT substrate 50.

In one embodiment, the conductive connecting element 52 is heated to melt the conductive solder layer 523 while in direct contact with the first electrode 25 of the micro LED 20, then the conductive solder layer 523 is solidified to firmly bond the first electrode 25. As such, the micro LED 20 becomes fixed to the TFT substrate 50.

As shown in FIG. 7, the drain electrode of the second TFT M2 and the drain electrode of the third TFT M3 are electrically coupled to the first electrode 25 of the micro LED 20. The drain electrode of the second TFT M2 is electrically coupled to the first electrode 25 of the micro LED 20 by the conductive connecting element 52. The drain electrode of the third TFT M3 is electrically coupled to the micro LED 20 by the contact electrode layer 54.

In one embodiment, the third TFT M3 has a function only during the process of transferring the micro LEDs 20 onto the TFT substrate 50. When the micro LED display panel is in use and displaying images, the third TFT M3 is not powered and only the first TFT M1 and the second TFT M2 operate. Therefore, the reference voltage Vref is not applied to the first electrode 25 of the micro LED 20 and thus does not affect emission of light from the micro LED 20. For example, when the micro LED display panel performs display function, the driving circuit 51 applies a direct current voltage Vdd to the first electrode 25 of the micro LED 20 by the first TFT M1 and the second TFT M2, and the driving circuit 51 applies another lesser voltage to the second electrode 26 of the micro LED 20. The micro LED 20 emits light under the forward bias. The first electrode 25 is generally referred to as an anode of the micro LED 20, and the second electrode 26 is generally referred to as a cathode of the micro LED 20.

The preparation method of the micro LED display panel of the present disclosure simultaneously patterns the insulating layer 53 and the contact electrode layer 54, the preparation process is simple. In addition, the high-accuracy standard in transferring the first electrode 25 of the micro LED 20 against the contact electrode 541 is reduced due to the through hole 55.

The present disclosure further provides a micro LED display panel made by the above method. The micro LED display panel may be a mobile phone, a tablet computer, a smart watch, or the like.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A micro light emitting diode (LED) display panel, comprising:
   at least one micro LED, a first electrode being on an end of each of the at least one micro LED; and
   a thin film transistor (TFT) substrate, the TFT substrate comprising a driving circuit;
   wherein a conductive connecting element is formed on the TFT substrate and electrically coupled to the driving circuit; an insulating layer is on the TFT substrate and covers the conductive connecting element;
   wherein a contact electrode layer is on a side of the insulating layer away from the TFT substrate; a through hole is defined in the contact electrode layer and the insulating layer and extends through the contact electrode layer and the insulating layer to expose the conductive connecting element; a surface of the insulating layer away from the TFT substrate is completely covered by the contact electrode layer; and
   wherein the contact electrode layer is in contact with the first electrode and extends through the insulating layer to be electrically coupled to the driving circuit; and the first electrode is bonded and electrically coupled to the conductive connecting element.

2. The micro LED display panel according to claim 1, wherein a projection of the first electrode on the TFT substrate covers a projection of the through hole on the TFT substrate.

3. The micro LED display panel according to claim 1, wherein the driving circuit comprises a plurality of data lines, and a plurality of scan lines, and a storage capacitor, a first TFT, a second TFT, and a third TFT corresponding to each of the at least one micro LED;
   wherein the storage capacitor comprises a first end and a second end electrically coupled to the direct current voltage;
   wherein the first TFT comprises a source electrode electrically coupled to one of the plurality of data lines, a gate electrode electrically coupled to one of the plurality of scan lines, and a drain electrode electrically coupled to the first end of the storage capacitor;
   wherein the second TFT comprises a source electrode electrically coupled to the direct current voltage, a gate electrode electrically coupled to the first end of the storage capacitor, and a drain electrode electrically coupled to the conductive connecting element; and
   wherein the third TFT comprises a source electrode electrically coupled to the reference voltage, a gate electrode electrically coupled to a control voltage, and a drain electrode electrically coupled to the contact electrode layer.

4. The micro LED display panel according to claim 1, wherein each of the at least one micro LED has at least one dimension less than one hundred micrometers.

5. The micro LED display panel according to claim 1, wherein each of the at least one micro LED comprises a P-type doped light emitting layer, an active layer, and an N-type doped light emitting layer, the active layer is between the P-doped light emitting layer and the N-doped light emitting layer, and the P-doped light emitting layer is electrically coupled to the first electrode.

6. The micro LED display panel according to claim 1, wherein the conductive connecting element comprises a conductive solder layer on the TFT substrate, and the conductive solder layer is welded to the first electrode.

7. The micro LED display panel according to claim 6, wherein the conductive connecting element further comprises a base conductive layer on the TFT substrate, and a conductive barrier layer on a side of the base conductive layer away from the TFT substrate; the conductive barrier layer is between the base conductive layer and the conductive solder layer; the conductive barrier layer prevents the conductive solder layer from diffusing into the base conductive layer.

8. The micro LED display panel according to claim 7, wherein the base conductive layer is made of indium tin oxide, the conductive solder layer is made of tin, and the conductive barrier layer is made of nickel or gold.

9. The micro LED display panel according to claim 7, wherein the base conductive layer comprises a first portion and a second portion spaced apart and insulated from the first portion, the conductive barrier layer and the conductive solder layer are sequentially stacked on the first portion, and a side of the second portion away from the TFT substrate is not covered by the conductive barrier layer and the conductive solder layer.

10. The micro LED display panel according to claim 9, wherein the insulating layer defines a contact hole exposing the second portion of the base conductive layer, and the contact electrode layer fills the contact hole and is electrically coupled to the driving circuit by the second portion of the base conductive layer.

11. The micro LED display panel according to claim 10, wherein the driving circuit comprises a plurality of data lines, and a plurality of scan lines, and a storage capacitor, a first TFT, a second TFT, and a third TFT corresponding to each of the at least one micro LED; wherein:
    the storage capacitor comprises a first end and a second end electrically coupled to the direct current voltage;
    the first TFT comprises a source electrode electrically coupled to one of the plurality of data lines, a gate electrode electrically coupled to one of the plurality of scan lines, and a drain electrode electrically coupled to the first end of the storage capacitor;
    the second TFT comprises a source electrode electrically coupled to the direct current voltage, a gate electrode electrically coupled to the first end of the storage capacitor, and a drain electrode electrically coupled to the first portion of the base conductive layer; and
    the third TFT comprises a source electrode electrically coupled to the reference voltage, a gate electrode electrically coupled to a control voltage, and a drain electrode electrically coupled to the second portion of the base conductive layer.

\* \* \* \* \*